(12) United States Patent
Chudzik et al.

(10) Patent No.: US 8,643,115 B2
(45) Date of Patent: Feb. 4, 2014

(54) STRUCTURE AND METHOD OF $T_{inv}$ SCALING FOR HIGH κ METAL GATE TECHNOLOGY

(75) Inventors: Michael P. Chudzik, Danbury, CT (US); Dechao Guo, Wappingers Falls, NY (US); Siddarth A. Krishnan, Peekskill, NY (US); Unoh Kwon, Fishkill, NY (US); Carl J. Radens, Lagrangeville, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 13/006,642

(22) Filed: Jan. 14, 2011

(65) Prior Publication Data

US 2012/0181616 A1    Jul. 19, 2012

(51) Int. Cl.
 *H01L 27/092* (2006.01)
(52) U.S. Cl.
 USPC ............. 257/369; 257/392; 257/E21.632; 257/E27.062
(58) Field of Classification Search
 USPC ............... 257/369, 392, E21.062, E27.062
 See application file for complete search history.

(56) References Cited

U.S. PATENT DOCUMENTS

| | | | |
|---|---|---|---|
| 7,023,055 B2 | 4/2006 | Ieong et al. | |
| 7,304,004 B2 | 12/2007 | Metzner et al. | |
| 7,329,923 B2 | 2/2008 | Doris et al. | |
| 7,531,468 B2 | 5/2009 | Metzner et al. | |
| 2005/0116290 A1 | 6/2005 | de Souza et al. | |
| 2006/0019033 A1 | 1/2006 | Muthukrishnan et al. | |
| 2008/0057737 A1 | 3/2008 | Metzner et al. | |
| 2009/0191675 A1* | 7/2009 | Mehrad et al. | 438/218 |

OTHER PUBLICATIONS

Srinivasan, P., et al., "Effect of Nitridation on 1/F Noise in N-MOSFETS With HFO2 Dielectric", ECS Transactions, 2006, 1 (5), pp. 681-691, The Electrochemical Society.

* cited by examiner

*Primary Examiner* — Long Pham
(74) *Attorney, Agent, or Firm* — Scully, Scott, Murphy & Presser, P.C.; Joseph P. Abate, Esq.

(57) ABSTRACT

A complementary metal oxide semiconductor (CMOS) structure including a scaled n-channel field effect transistor (nFET) and a scaled p-channel field transistor (pFET) which do not exhibit an increased threshold voltage and reduced mobility during operation is provided Such a structure is provided by forming a plasma nitrided, nFET threshold voltage adjusted high k gate dielectric layer portion within an nFET gate stack, and forming at least a pFET threshold voltage adjusted high k gate dielectric layer portion within a pFET gate stack. In some embodiments, the pFET threshold voltage adjusted high k gate dielectric layer portion in the pFET gate stack is also plasma nitrided. The plasma nitrided, nFET threshold voltage adjusted high k gate dielectric layer portion includes up to 15 atomic % $N_2$ and an nFET threshold voltage adjusted species located therein, while the plasma nitrided, pFET threshold voltage adjusted high k gate dielectric layer portion includes up to 15 atomic % $N_2$ and a pFET threshold voltage adjusted species located therein.

16 Claims, 11 Drawing Sheets

STRUCTURE AND METHOD OF T$_{inv}$ SCALING FOR HIGH κ METAL GATE TECHNOLOGY

BACKGROUND

The present disclosure relates to a semiconductor structure and a method of fabricating the same. More particularly, the present disclosure provides a complementary metal oxide semiconductor (CMOS) structure including a scaled n-channel field effect transistor (nFET) and a scaled p-channel field transistor (pFET) which do not exhibit an increased threshold voltage and reduced mobility during operation. The present disclosure also provides methods of fabricating such a CMOS structure.

One trend in modern integrated circuit manufacture is to produce semiconductor devices, such as field effect transistors (FETs), which are as small as possible. In a typical FET, a source and a drain are formed in an active region of a semiconductor substrate by implanting n-type or p-type impurities in the semiconductor material. Disposed between the source and the drain is a channel (or body) region. Disposed above the body region is a gate electrode. The gate electrode and the body are spaced apart by a gate dielectric layer.

Although the fabrication of smaller transistors allows more transistors to be placed on a single substrate for the formation of relatively large circuit systems in a relatively small die area, this downscaling can result in a number of performance degrading effects. For example, the downscaling of n-channel field effect transistors (nFETs) and p-channel field effect transistors (pFETs) may result in a scaled inversion layer thickness (Tiny) being located between the gate dielectric layer and the semiconductor substrate. The prior art scaled Tinv nFETs and pFETs, however, exhibit a shift in threshold voltage and a reduction in electron/hole mobility which, in turn, negatively impact the performance of the scaled Tinv nFET or pFET device.

SUMMARY

A complementary metal oxide semiconductor (CMOS) structure including a scaled n-channel field effect transistor (nFET) and a scaled p-channel field transistor (pFET) which do not exhibit an increased threshold voltage and reduced mobility during operation is provided. Such a structure is provided by forming a plasma nitrided, nFET threshold voltage adjusted high k gate dielectric layer portion within an nFET gate stack, and forming at least a pFET threshold voltage adjusted high k gate dielectric layer portion within a pFET gate stack. In some embodiments, the pFET threshold voltage adjusted high k gate dielectric layer portion in the pFET gate stack is also plasma nitrided. The plasma nitrided, nFET threshold voltage adjusted high k gate dielectric layer portion includes up to 15 atomic % N$_2$ and an nFET threshold voltage adjusted species located therein, while the plasma nitrided, pFET threshold voltage adjusted high k gate dielectric layer portion includes up to 15 atomic % N$_2$ and a pFET threshold voltage adjusted species located therein.

In one aspect of the present disclosure a method of fabricating a complementary metal oxide semiconductor structure (CMOS) is provided. The method includes providing a plasma nitrided, nFET threshold voltage adjusted high k gate dielectric layer portion within an nFET device region of a semiconductor structure and a plasma nitrided, pFET threshold voltage adjusted high k gate dielectric layer portion within a pFET device region of the semiconductor substrate. A gate electrode layer can then be formed atop both the plasma nitrided, nFET threshold voltage adjusted high k gate dielectric layer portion and the plasma nitrided, pFET threshold voltage adjusted high k gate dielectric layer portion. Thereafter, an nFET gate stack can be formed in the nFET device region and a pFET gate stack can be formed in the pFET device region, wherein the nFET gate stack includes, from bottom to top, the plasma nitrided, nFET threshold voltage adjusted high k gate dielectric layer portion and a first patterned portion of the gate electrode layer and the pFET gate stack includes, from bottom to top, the plasma nitrided, pFET threshold voltage adjusted high k gate dielectric layer portion and a second patterned portion of the gate electrode layer.

In one embodiment of the present disclosure, the providing the plasma nitrided, nFET threshold voltage adjusted high k gate dielectric layer portion within the nFET device region of the semiconductor structure and the plasma nitrided, pFET threshold voltage adjusted high k gate dielectric layer portion within the pFET device region of the semiconductor substrate includes forming a high k gate dielectric layer within the nFET device region of the semiconductor substrate and the pFET device region of the semiconductor substrate. A patterned trilayer metal stack including at least a pFET threshold voltage adjusting material layer is formed on a portion of the high k gate dielectric within the pFET device region, while leaving another portion of the high k gate dielectric within the nFET device region exposed. An nFET threshold voltage adjusting material layer is formed in both device regions. Next, an anneal is performed that diffuses nFET threshold voltage adjusting species from the nFET threshold voltage adjusting material layer into the underlying portion of the high k gate dielectric layer in the nFET device region, while diffusing pFET threshold voltage species from the pFET threshold voltage adjusting material layer into the underlying portion of the high k gate dielectric in the pFET device region. The anneal thus forms an nFET threshold voltage adjusted high k gate dielectric layer portion and a pFET threshold voltage adjusted high k gate dielectric layer portion. The nFET threshold voltage adjusting material layer and the patterned trilayer metal stack are then removed exposing both the nFET threshold voltage adjusted high k gate dielectric layer portion and the pFET threshold voltage adjusted high k gate dielectric layer portion. The exposed nFET threshold voltage adjusted high k gate dielectric portion and the pFET threshold voltage adjusted high k gate dielectric layer portion are then subjected to plasma nitridation forming the plasma nitrided, nFET threshold voltage adjusted high k gate dielectric layer portion and the plasma nitrided, pFET threshold voltage adjusted high k gate dielectric layer portion.

In another embodiment of the present disclosure, the providing the plasma nitrided, nFET threshold voltage adjusted high k gate dielectric layer portion within the nFET device region of the semiconductor structure and the plasma nitrided, pFET threshold voltage adjusted high k gate dielectric layer portion within the pFET device region of the semiconductor substrate includes forming a high k gate dielectric layer within the nFET device region of the semiconductor substrate and the pFET device region of the semiconductor substrate. The high k gate dielectric layer is then subjected to plasma nitridation to form a plasma nitrided high k gate dielectric layer. A patterned trilayer metal stack including at least a pFET threshold voltage adjusting material layer is formed on a portion of the plasma nitrided high k gate dielectric within the pFET device region, while leaving another portion of the plasma nitrided high k gate dielectric within the nFET device region exposed. An nFET threshold voltage adjusting material layer is formed in both device regions.

Next, an anneal is performed that diffuses nFET threshold voltage adjusting species from the nFET threshold voltage adjusting material layer into the underlying portion of the plasma nitrided high k gate dielectric layer in the nFET device region, while diffusing pFET threshold voltage species from the pFET threshold voltage adjusting material layer into the underlying portion of the plasma nitrided high k gate dielectric in the pFET device region. The anneal thus forms the plasma nitrided, nFET threshold voltage adjusted high k gate dielectric layer portion and the plasma nitrided, pFET threshold voltage adjusted high k gate dielectric layer portion. The nFET threshold voltage adjusting layer and the patterned trilayer metal stack are then removed exposing both the plasma nitrided, nFET threshold voltage adjusted high k gate dielectric layer portion and the plasma nitrided, pFET threshold voltage adjusted high k gate dielectric layer portion.

In another aspect of the present disclosure, a further method is provided that includes providing a plasma nitrided, nFET threshold voltage adjusted high k gate dielectric layer portion within an nFET device region of a semiconductor structure and a pFET threshold voltage adjusted high k gate dielectric layer portion within a pFET device region of the semiconductor substrate. A gate electrode layer can then be formed atop both the plasma nitrided, nFET threshold voltage adjusted high k gate dielectric layer portion and the pFET threshold voltage adjusted high k gate dielectric layer portion. Thereafter, an nFET gate stack can be formed in the nFET device region and a pFET gate stack can be formed in the pFET device region, wherein the nFET gate stack includes, from bottom to top, the plasma nitrided, nFET threshold voltage adjusted high k gate dielectric layer portion and a first patterned portion of the gate electrode layer and the pFET gate stack includes, from bottom to top, the pFET threshold voltage adjusted high k gate dielectric layer portion and a second patterned portion of the gate electrode layer.

In this aspect of the present disclosure, the providing the plasma nitrided, nFET threshold voltage adjusted high k gate dielectric layer portion within the nFET device region of the semiconductor structure and the pFET threshold voltage adjusted high k gate dielectric layer portion within the pFET device region of the semiconductor substrate includes forming a high k gate dielectric layer within the nFET device region of a semiconductor substrate and the pFET device region of the semiconductor substrate. A patterned trilayer metal stack including at least a pFET threshold voltage adjusting material layer is formed on a portion of the high k gate dielectric within the pFET device region, while leaving another portion of the high k gate dielectric within the nFET device region exposed. An nFET threshold voltage adjusting material layer is formed in both device regions. The nFET threshold voltage adjusting material layer is then subjected to plasma nitridation forming a plasma nitrided, nFET threshold voltage adjusting material layer. Next, an anneal is performed that diffuses nitrogen and nFET threshold voltage adjusting species from the plasma nitrided, nFET threshold voltage adjusting material layer into the underlying portion of the high k gate dielectric layer in the nFET device region, while diffusing pFET threshold voltage species from the pFET threshold voltage adjusting material layer into the underlying portion of the high k gate dielectric in the pFET device region. The anneal thus forms the plasma nitrided, nFET threshold voltage adjusted high k gate dielectric layer portion and the pFET threshold voltage adjusted high k gate dielectric layer portion. The plasma nitrided nFET threshold voltage adjusting material layer and the patterned trilayer metal stack are then removed exposing both the plasma nitrided, nFET threshold voltage adjusted high k gate dielectric layer portion and the pFET threshold voltage adjusted high k gate dielectric layer portion.

Another aspect of the present application relates to a complementary semiconductor (CMOS) structure that can be formed. In one embodiment, a CMOS structure is provided that includes a semiconductor substrate having an nFET device region and a pFET device. An nFET gate stack is located in the nFET device region and a pFET gate stack is located in the pFET device region. The nFET gate stack includes, from bottom to top, a plasma nitrided, nFET threshold voltage adjusted high k gate dielectric layer portion including up to 15 atomic % $N_2$, and a first patterned portion of a gate electrode layer. The pFET gate stack includes, from bottom to top, a plasma nitrided, pFET threshold voltage adjusted high k gate dielectric layer portion including up to 15 atomic % $N_2$, and a second patterned portion of a gate electrode layer.

In another embodiment of the present disclosure a complementary semiconductor (CMOS) structure is provided that includes a semiconductor substrate having an nFET device region and a pFET device; and an nFET gate stack located in the nFET device region and a pFET gate stack located in the pFET device region, wherein the nFET gate stack includes, from bottom to top, a plasma nitrided, nFET threshold voltage adjusted high k gate dielectric layer portion including up to 15 atomic % $N_2$, and a first patterned portion of a gate electrode layer, and a pFET gate stack includes, from bottom to top, a pFET threshold voltage adjusted high k gate dielectric layer portion, and a second patterned portion of a gate electrode layer.

DETAILED DESCRIPTION

Figure 1:
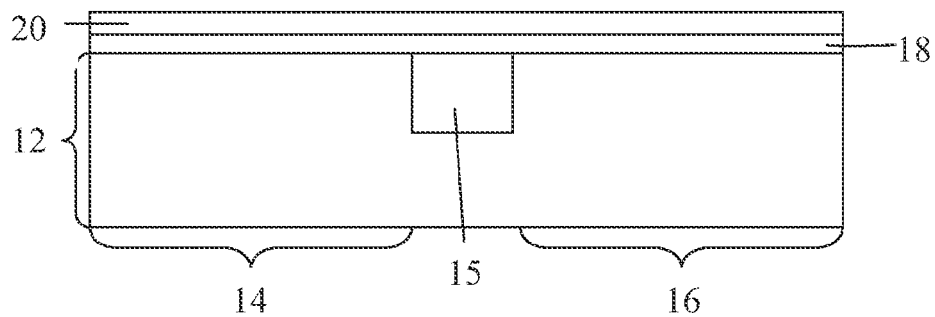
FIG. 1 is a pictorial representation (through a cross sectional view) illustrating an initial structure including a semiconductor substrate having an nFET device region and a pFET device region, an optional interfacial layer located on an upper surface of the semiconductor substrate in both device regions, and a high k gate dielectric layer located on an upper surface of the optional interfacial layer that can be employed in one embodiment of the present disclosure.

The present disclosure, which provides a complementary metal oxide semiconductor (CMOS) structure including a scaled n-channel field effect transistor (nFET) and a scaled p-channel field transistor (pFET) which do not exhibit an increased threshold voltage and reduced mobility during operation, and methods of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the various embodiments of the present disclosure. However, it will be appreciated by one of ordinary skill in the art that the invention may be practiced without these specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 1-9 which are pictorial representations (through cross sectional views) illustrating the CMOS structure of the present disclosure during various stages of fabrication in accordance with one embodiment of the present application. The method of this embodiment includes providing the initial structure 10 shown in FIG. 1. The initial structure 10 shown in FIG. 1 includes a semiconductor substrate 12 having an nFET device region 14 and a pFET device region 16, an optional interfacial layer 18 located on an upper surface of the semiconductor substrate 12 in both device regions, and a high k gate dielectric layer 20 located on an upper surface of the optional interfacial layer 18. When the optional interfacial layer 18 is not present in the initial structure 10, the high k gate dielectric layer 20 would be located on an upper surface of the semiconductor substrate 12 in both device regions. It is noted that although one nFET device region 14 and one pFET device region 16 are shown and illustrated, the semiconductor substrate 12 may include a plurality of nFET device regions and a plurality of pFET device regions located therein.

The semiconductor substrate 12 illustrated in FIG. 1 can be comprised of any semiconductor material including, but not limited to, Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments, the semiconductor substrate 12 is composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region typically have different conductivities. These doped regions are known as "wells" and they are formed utilizing conventional ion implantation processes. For example, the nFET device region 14 may include an n-well, while the pFET device region 16 may include a p-well. The doping concentrations with the various well regions may be the same or different.

At least one isolation region 15 is then typically formed into the semiconductor substrate 12. The at least one isolation region 15 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region 15 provides isolation between neighboring gate regions, typically required when the neighboring gates have opposite conductivities, i.e., nFETs and pFETs.

After processing the semiconductor substrate 12, optional interfacial layer 18 can be optionally formed on the surface of the semiconductor substrate 12. The optional interfacial layer 18 can be formed utilizing a conventional growing technique that is well known to those skilled in the art including, for example, oxidation or oxynitridation. In some embodiments, the optional interfacial layer 18 is formed by a wet chemical oxidation process. When the substrate 12 is a Si-containing semiconductor, the optional interfacial layer 18 can be comprised of silicon oxide, silicon oxynitride or a nitrided silicon oxide. When the substrate 12 is other than a Si-containing semiconductor, the optional interfacial layer 18 may comprise a semiconducting oxide, a semiconducting oxynitride or a nitrided semiconducting oxide. The thickness of the optional interfacial layer 18 is typically from about 0.5 nm to about 1.2 nm, with a thickness from about 0.8 nm to about 1 nm being more typical. The thickness, however, may be different after processing at higher temperatures, which are usually required during CMOS fabrication. The optional interfacial layer 18 typically has a dielectric constant of less than 8.0.

High k gate dielectric layer 20 is then formed overlying the semiconductor substrate 12. In one embodiment, and as shown, the high k gate dielectric layer 20 is formed directly on an upper surface of the optional interfacial layer 18. In another embodiment, not shown, the high k gate dielectric layer 20 can be formed directly on an upper surface of the semiconductor substrate 12. The high k gate dielectric layer 20 employed includes any dielectric metal oxide having a dielectric constant that is greater than the dielectric constant of silicon oxide, e.g., 3.9. Typically, the high k gate dielectric layer 20 has a dielectric constant greater than 4.0, with a dielectric constant of greater than 8.0 being even more typical. Exemplary high k dielectric materials that can be used as the high k gate dielectric layer 20 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. In one embodiment, a Hf-containing high k material such as $HfO_2$ is employed as the high k gate dielectric layer 20. Multilayered stacks of these high k materials can also be employed as the high k gate dielectric layer 20. Each value of x is independently from 0.5 to 3 and each value of y is independently from 0 to 2.

The thickness of the high k gate dielectric layer 20 may vary depending on the technique used to form the same. Typically, however, the high k gate dielectric layer 20 has a thickness from 0.5 nm to 10 nm, with a thickness from 1.0 nm to 5 nm being even more typical. The high k gate dielectric layer 20 employed may have an effective oxide thickness on the order of, or less than, 1 nm.

The high k gate dielectric layer 20 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Figure 2:
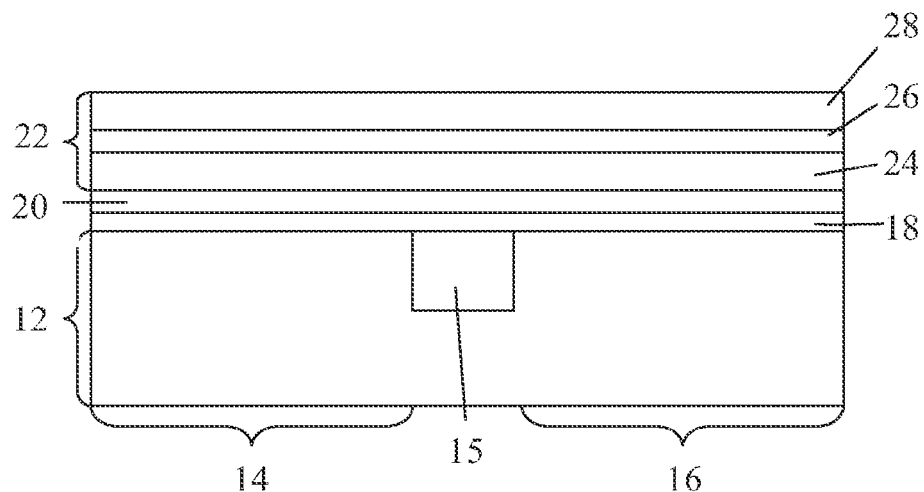
FIG. 2 is a pictorial representation (through a cross sectional view) illustrating the initial structure of FIG. 1 after forming a trilayer metal stack on an upper surface of the high k gate dielectric layer.

Referring now to FIG. 2, there is illustrated the structure of FIG. 1 after forming a trilayer metal stack 22 on an upper surface of the high k gate dielectric layer 20 in both the device regions. The trilayer metal stack 22 includes, from bottom to top, a first metal nitride layer 24, a metal layer 26 and a second metal nitride layer 28.

The first metal nitride layer 24 and the second metal nitride layer 28 of the trilayer metal stack 22 may be comprised of the same or different metal nitrides. Illustrative metal nitrides that can be employed as the first metal nitride layer 24 and the second metal nitride layer 28 include, but are not limited to, TiN, TaN, WN, and TiAlN. Combinations of these metal nitrides can also be employed. In one embodiment of the present disclosure, the first metal nitride layer 24 and the second metal nitride layer 28 are both composed of TiN. The first metal nitride layer 24 and the second metal nitride layer 28 can be formed utilizing the same or different deposition method. Illustrative deposition methods that can be employed in forming the first metal nitride layer 24 and the second metal nitride layer 28 include, but are not limited to, chemical vapor deposition (CVD), plasma enhanced chemical vapor deposition, sputtering, and physical vapor deposition (PVD). The thickness of the first metal nitride layer 24 of the trilayer metal stack 22 may vary depending on the type of metal nitride employed as well as the deposition technique used in forming the same. Typically, the first metal nitride layer 24 has a thickness from 5 Å (angstroms) to 50 Å, with a thickness from 10 Å to 30 Å being more typical from the first metal nitride layer 24. The thickness of the second metal nitride layer 28 of the trilayer metal stack 22 may vary depending on the type of metal nitride employed as well as the deposition technique used in forming the same. Typically, the second metal nitride layer 28 has a thickness from 0.5 nm to 5 nm, with a thickness from 0.1 nm to 3 nm being more typical from the second metal nitride layer 28.

As mentioned above, the trilayer metal stack 22 also includes a metal layer 26 sandwiched between the first metal nitride layer 24 and the second metal nitride layer 28. The metal layer 28 includes any pFET threshold voltage adjusting material layer such as, for example, Ta, Ti, Al, and Ge. Combinations or multilayers of these metallic materials can also be employed as the metal layer 26. In one embodiment of the present disclosure, Al can be employed as the metal layer 26. The metal layer 26 can be formed utilizing a conventional deposition process including, but not limited to, chemical vapor deposition (CVD), physical vapor deposition (PECVD), sputtering, plating and physical vapor deposition (PVD). The thickness of the metal layer 26 of the trilayer metal stack 22 may vary depending on the metallic material employed as well as the technique used in forming the same. Typically, the metal layer 26 of the trilayer metal stack 22 has a thickness from 2 Å to 50 Å, with a thickness from 5 Å to 20 Å being more typical. Metal layer 26 can also be referred to herein as a pFET threshold voltage adjusting material layer.

Figure 3:
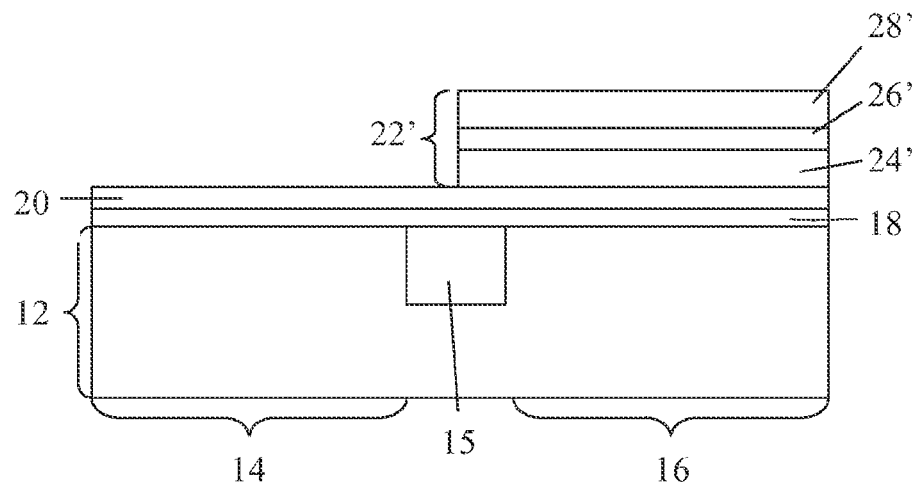
FIG. 3 is a pictorial representation (through a cross sectional view) illustrating the structure of FIG. 2 after removing a first portion of the trilayer metal stack from atop the nFET device region, while leaving a second portion of the trilayer metal stack atop the pFET device region.

Referring now to FIG. 3, there is illustrated the structure of FIG. 2 after removing a first portion of the trilayer metal stack 22 from atop the nFET device region 14, while leaving a second portion of the trilayer metal stack atop the pFET device region 16. The remaining second portion of the trilayer metal stack 22, which can also be referred to herein as a patterned trilayer metal stack, is labeled as 22' in the drawing. It is observed that the patterned trilayer metal stack 22' is employed as a block mask so as to prevent subsequent diffusion of an nFET threshold voltage adjusting species from an nFET threshold voltage adjusting material layer (to be subsequently formed) into a portion of the high k gate dielectric layer 20 that is located within the pFET device region 16. Also, the patterned trilayer metal stack 22' includes a pFET threshold voltage adjusting material as one or its layers as such, and during a subsequent anneal, this layer can stabilize the threshold voltage of the pFET device.

The structure shown in FIG. 3 is formed by lithography and etching. The lithography step includes first providing a photoresist (not shown) atop the upper surface of the trilayer metal stack 22. The photoresist can include a positive-tone photoresist material, a negative-tone photoresist material or a hybrid photoresist material, each of which is well known to those skilled in the art. The photoresist can be formed utilizing any conventional resist deposition process such as, for example, spin-on coating, spray coating or evaporation. After applying the photoresist on an upper surface of the trilayer metal stack 22, the photoresist is exposed to a desired pattern of radiation and thereafter the exposed resist is developed utilizing a conventional resist developer. This results in a patterned photoresist (not shown) atop the trilayer metal stack 22 in the pFET device region 16. The exposed trilayer metal stack 22 in the nFET device region 14 is then etched utilizing dry etching, wet etching or a combination thereof. Dry etching includes reactive ion etching, plasma etching, ion beam etching or laser ablation. Wet etching includes a chemical etchant that selectively removes at least one of the layers of the trilayer metal stack 22 in the nFET device region 14. The patterned resist can be removed anytime after the pattern has been transferred into one of the layers of the trilayer stack 22 in the nFET device region 14 utilizing a conventional resist removal process such as, for example, ashing. Alternatively, the patterned resist can remaining atop the trilayer metal stack 22 in the pFET device region 16 during the removal of the exposed portions of the trilayer metal stack 22 in the nFET device region 14 and be removed after completely removal of the trilayer metal stack from the nFET device region 14 by a conventional resist removal process such as, for example, ashing. The etching, which may include a single etch or multiple etches, stops on an upper surface of the high k gate dielectric layer 20. As such, a portion of the high k gate dielectric layer that is within the nFET device region 14 is now exposed.

Figure 4:
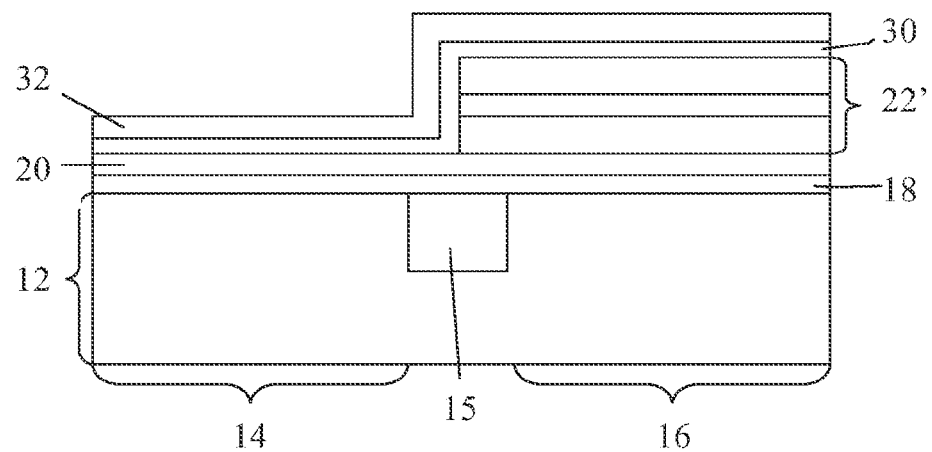
FIG. 4 is a pictorial representation (through a cross sectional view) illustrating the structure of FIG. 3 after forming an nFET threshold voltage adjusting material layer and an optional metallic material layer atop the exposed upper surfaces of the structure in both device regions.

Referring now to FIG. 4, there is shown the structure of FIG. 3 after forming an nFET threshold voltage adjusting material layer 30 and an optional metallic material layer 32 atop the exposed upper surfaces, e.g., the exposed high k gate dielectric layer 20 in the nFET device region 14 and the patterned trilayer metal stack 22' in the pFET device region 16, of the structure in both device regions. It is also observed that a portion of the nFET threshold voltage adjusting material layer 30 is located on exposed sidewalls of the patterned trilayer metal stack 22'.

The nFET threshold voltage adjusting material layer 30 can comprise a rare earth metal-containing material or an alkaline earth metal-containing material. The rare earth metal-containing materials that can be used as the nFET threshold voltage adjusting material layer 30 include an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. In one embodiment, lanthanum-containing compounds such as $La_2O_3$ or LaN are employed as the nFET threshold voltage adjusting material layer 30.

The rare earth metal-containing material is formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In one embodiment, the rare earth metal-containing material is formed by placing the structure into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° C. to 1700° C., and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1\times10^{-5}$ Torr to $8\times10^{-5}$ Torr, and the La oxide growth rate can be in the range from 0.1 nm per minute to 2 nm per minute, with a range from 0.5 nm per minute to 1.5 nm per minute being more typical.

The rare earth metal-containing materials that can be used as the nFET threshold voltage adjusting material layer 30 comprises a compound having the formula $MA_x$ wherein M is an alkaline earth metal (Be, Mg, Ca, Sr, and/or Ba), A is one of O, S and a halide, and x is 1 or 2. It is noted that the present disclosure contemplates alkaline earth metal-containing compounds that include a mixture of alkaline earth metals and/or a mixture of anions. Examples of alkaline earth metal-containing compounds that can be used include, but are not limited to, MgO, MgS, $MgF_2$, $MgCl_2$, $MgBr_2$, $MgI_2$, CaO, CaS, CaF$_2$, CaCl$_2$, CaBr$_2$, CaI$_2$, SrO, SrS, SrF$_2$, SrCl$_2$, SrBr$_2$, SrI$_2$, BaO, BaS, BaF$_2$, BaCl$_2$, BaBr$_2$, and BaI$_2$.

The alkaline earth metal-containing material can be formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes.

Notwithstanding the type of material used as the nFET threshold voltage adjusting material layer 30, the nFET threshold voltage adjusting material layer 30 typically has a thickness from 0.1 nm to 5.0 nm, with a thickness from 0.3 nm to 2.0 nm being even more typical.

After providing the nFET threshold voltage adjusting material layer 30 to the structure shown in FIG. 3, an optional metallic material layer 32 can be formed atop the upper exposed surfaces of the nFET threshold voltage adjusting material layer 30. In some embodiments, the optional metallic material layer 32 is not formed. The optional metallic material layer 32, if present, includes a material that encapsulates the nFET threshold voltage adjusting material layer 30 during a subsequent anneal to prevent loss of material, e.g., nFET threshold voltage adjusting species, from the nFET threshold voltage adjusting material layer 30 and to ensure that the nFET threshold voltage adjusting species is driven into the material of the high k gate dielectric layer 20 in the nFET device region 14.

The optional metallic material layer 32 can include a conductive metal nitride such as, for example, TiN, TaN, WN or combinations thereof. In one embodiment, the optional metallic material layer 32 is composed of TiN. The optional metallic material layer 32 can be formed utilizing any conventional deposition process including, for example, chemical vapor deposition (CVD), plasma enhanced chemical vapor deposition (PECVD), sputtering or physical vapor deposition. The thickness of the optional metallic material layer 32 may vary depending on the type of material employed as well as the technique that is employed in forming the same. Typically, the optional metallic material layer 32 has a thickness from 0.5 nm to 8 nm, with a thickness from 2 nm to 5 nm being more typical.

Figure 5:
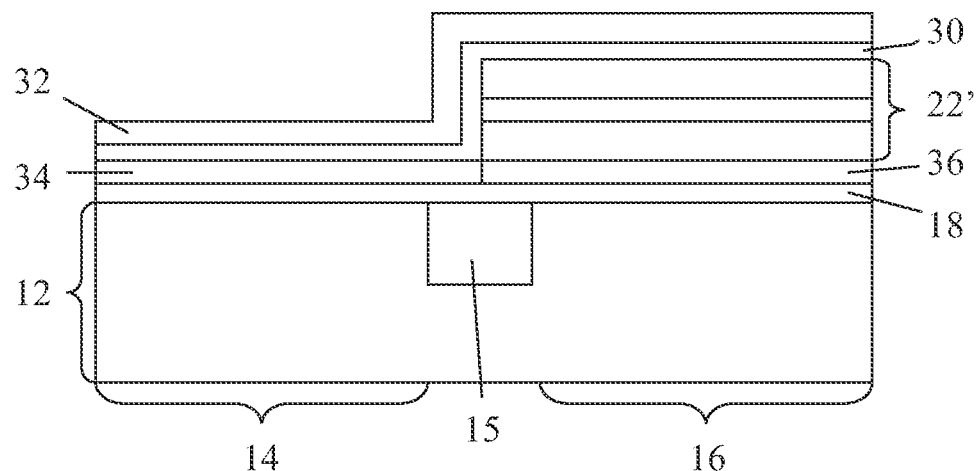
FIG. 5 is a pictorial representation (through a cross sectional view) illustrating the structure of FIG. 4 after performing an annealing that drives nFET threshold voltage adjusting species from the nFET threshold voltage adjusting material layer into the underlying high k gate dielectric layer within the nFET device region and pFET threshold voltage adjusting species from a metal layer of the trilayer stack into the underlying high k gate dielectric within the pFET device region.

Referring to FIG. 5, there is depicted the structure of FIG. 4 after performing an annealing that drives nFET threshold voltage adjusting species (e.g., rare earth metal-containing ion or alkaline earth metal-containing ion) from the nFET threshold voltage adjusting material layer 30 into the underlying high k gate dielectric layer 20 within nFET device region 14 and pFET threshold voltage adjusting species (e.g., an ion of Ta, Ti, Al or Ge) from the metal layer 26 of the patterned trilayer metal stack 22' into the underlying high k gate dielectric 20 within the pFET device region 16. In FIG. 5, reference numeral 34 denotes an nFET adjusted high k gate dielectric layer portion that includes nFET threshold voltage adjusting species, while reference numeral 36 denotes a pFET adjusted high k gate dielectric layer portion that includes pFET threshold voltage adjusting species. In some embodiments, the nFET and/or the pFET threshold voltage species may diffusion into portions of the underlying interfacial layer 18.

The 'drive-in' anneal used in forming the structure shown in FIG. 5 is performed to induce diffusion of the threshold voltage adjusting species from the corresponding threshold voltage adjusting material layer, e.g., layer 28 or 30, into the underlying portions of the high k gate dielectric layer 20. The temperature of the drive-in anneal is typically performed at a temperature from 400° C. to 1100° C., with a temperature from 700° C. to 1000° C. being more typical. The drive-in anneal may be performed utilizing a furnace anneal, a rapid thermal anneal, a laser anneal or a microwave anneal. The duration of the drive-in anneal may vary depending on the type of anneal employed. Typically, the duration of the drive-in anneal is from 1 second to 2 hours, with a duration from 30 seconds to 0.5 hours being more typical.

Figure 6:
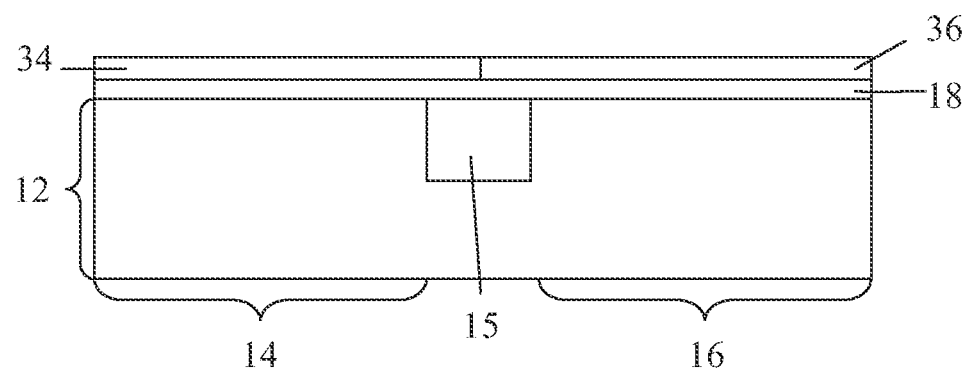
FIG. 6 is a pictorial representation (through a cross sectional view) depicting the structure of FIG. 5 after removing metal structures and the nFET threshold voltage adjusting material layer from both device regions.

Referring now to FIG. 6, there is shown the structure of FIG. 5 after removing metal structures, e.g., the optional metallic material layer 32 and patterned trilayer metal stack 22', and the nFET threshold voltage adjusting material layer 30 from both device regions selective to the nFET adjusted high k gate dielectric layer portion 34 and the pFET adjusted high k gate dielectric layer portion 36. The removal of the metal structures is performed utilizing one or more etching steps including wet etching and/or dry etching. In one embodiment, one or more wet etching steps are employed in removing the metal structures from atop the nFET adjusted high k gate dielectric layer portion 34 and the pFET adjusted high k gate dielectric layer portion 36.

Figure 7:
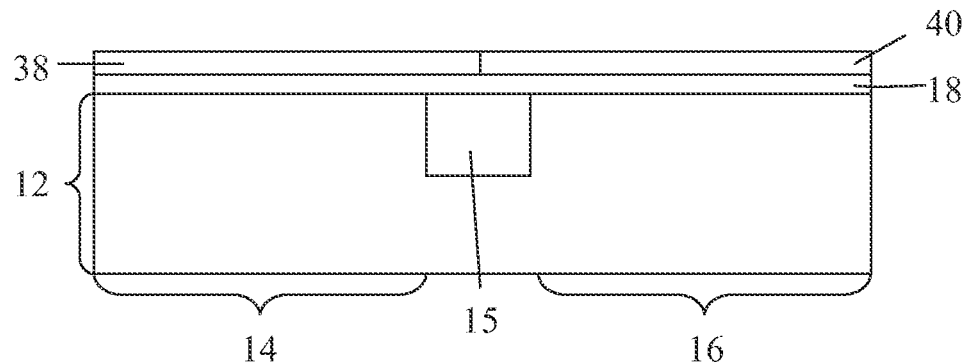
FIG. 7 is a pictorial representation (through a cross sectional view) depicting the structure of FIG. 6 after performing plasma nitridation, followed by an optional oxygen-free anneal step.

Referring now to FIG. 7, there is illustrated the structure of FIG. 6 after performing plasma nitridation, followed by an optional oxygen-free anneal step. In FIG. 7, reference numeral 38 denotes the plasma nitrided, nFET adjusted high k gate dielectric layer portion and reference numeral 40 denotes the plasma nitrided, pFET adjusted high k gate dielectric layer portion.

The plasma nitridation can be performed utilizing any conventional plasma nitridation tool. The plasma nitridation process can be performed using any nitrogen-containing plasma source such as, for example, N$_2$, NH$_3$, N$_2$O and NO. The plasma nitridation is typically performed at a temperature from 0° C. to 500° C., with a plasma nitridation temperature from 100° C. to 375° C. being more typical. In some embodiments, a special tool called a slot plate antenna (SP) tool is used to perform the plasma nitridation. In further embodiments, the plasma nitridation is performed using a two liter flow of nitrogen in which Ar is employed as the carrier gas.

Following the plasma nitridation process, an optional oxygen-free anneal can be performed. The oxygen-free anneal is performed in an ambient in which substantially no oxygen (less than 0.5 ppm) is present. In one embodiment, the oxygen-free anneal is performed in an inert ambient such as, for example, He, Ar, or mixtures thereof. The oxygen-free anneal is typically performed at a temperature from 400° C. to 800° C., with an oxygen-free anneal temperature from 650° C. to 750° C. being more typical. The oxygen-free anneal may be performed utilizing a furnace anneal, a rapid thermal anneal, a laser anneal or a microwave anneal. The duration of the oxygen-free anneal may vary depending on the type of anneal employed. Typically, the duration of the oxygen-free anneal is from 1 second to 2 hours, with a duration from 60 seconds to 0.5 hours being more typical.

The plasma nitrided, nFET adjusted high k gate dielectric layer portion 38 and the plasma nitrided, pFET adjusted high k gate dielectric layer portion 40 each have a concentration of nitrogen therein that is up to 15 atomic % N$_2$. Typically, the concentration of nitrogen in both the plasma nitrided, nFET adjusted high k gate dielectric layer portion 38 and the plasma nitrided, pFET adjusted high k gate dielectric layer portion 40 is from 5 atomic % N$_2$ to 12 atomic % N$_2$.

Figure 8:
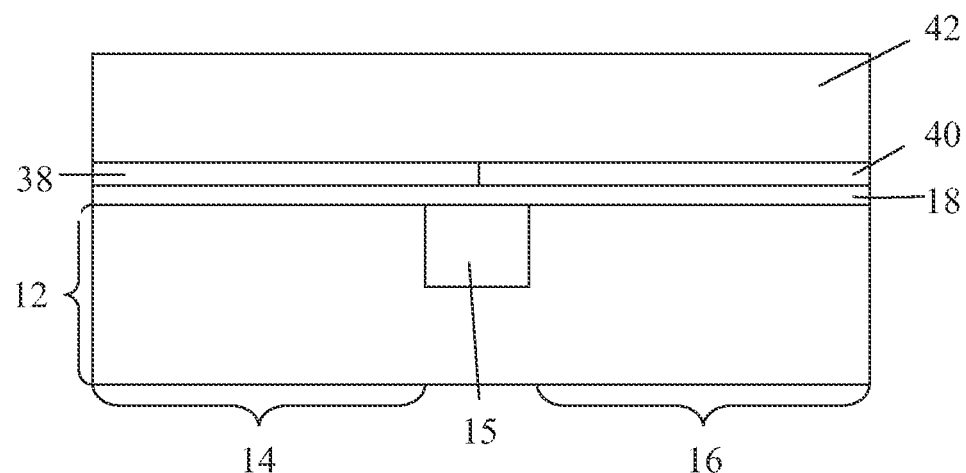
FIG. 8 is a pictorial representation (through a cross sectional view) depicting the structure of FIG. 7 after forming a gate electrode layer within both device regions.

Referring to FIG. 8, there is shown the structure of FIG. 7 after forming a gate electrode layer 42 within both device regions. As shown, the gate electrode layer 42 is formed atop the plasma nitrided, nFET adjusted high k gate dielectric layer portion 38 and the plasma nitrided, pFET adjusted high k gate dielectric layer portion 40 of the structure shown in FIG. 7.

The gate electrode layer 42 that is employed may comprise any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate electrode layer 42 is comprised of elemental metal. In some instances, a single layer of conductive material is formed and is employed as the gate electrode layer 42. In other instances, a first layer of conductive material and a second layer of conductive material are formed and are employed as the gate electrode layer 42. In one embodiment, the gate electrode layer 42 may include a stack, from bottom to top, of a conductive metal layer and an upper conductive Si-containing material layer; the conductive metal layer has a higher conductivity than the conductive Si-containing material layer.

The gate electrode layer 42 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the gate electrode layer 42, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed.

The as deposited gate electrode layer 42 typically has a thickness from 5 nm to 200 nm, with a thickness from 20 nm to 100 nm being more typical. The conductive material employed as the gate electrode layer 42 in the different device regions can be the same or different. Different gate conductive materials can be formed using block mask technology.

In some embodiments, an optional hard mask material (not shown) can be formed atop the gate electrode layer 42. The optional hard mask material includes an oxide, a nitride, an oxynitride or any combination thereof including multilayered stacks. When present, the optional hard mask material is formed utilizing a conventional deposition process well known to those skilled in the art including, for example, CVD and PECVD. Alternatively, the optional hard mask material can be formed by a thermal process such as, for example, oxidation and/or nitridation. The thickness of the optional hard mask material may vary depending on the exact hard mask material employed as well as the process that is used in forming the same. Typically, the hard mask material has a thickness from 5 nm to 200 nm, with a thickness from 10 nm to 50 nm being more typical. The hard mask material is typically employed when the conductive material is a Si-containing material such as polysilicon or SiGe.

Figure 9:
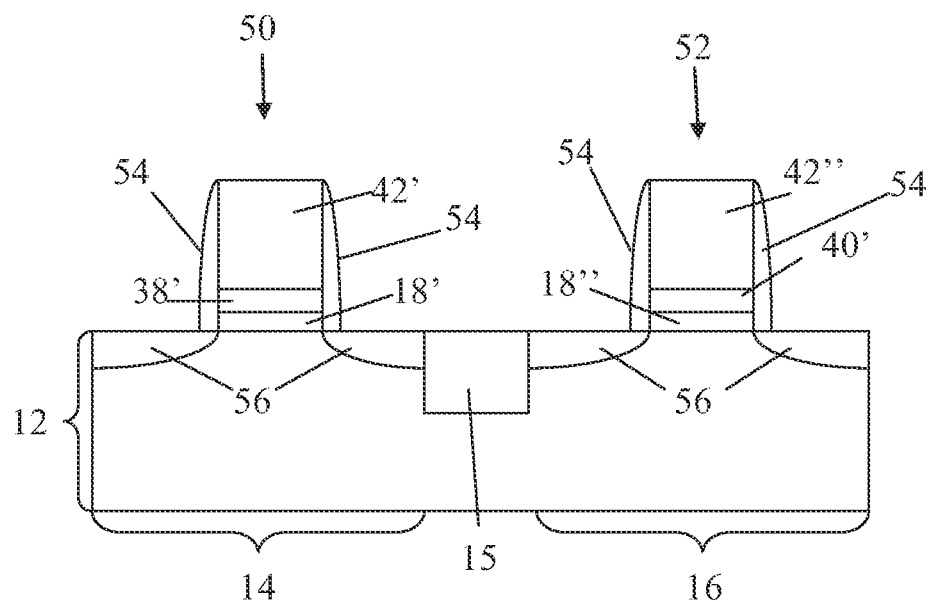
FIG. 9 is a pictorial representation (through a cross sectional view) depicting the structure of FIG. 8 after performing further CMOS processing steps.

Referring now to FIG. 9, there is depicted the structure of FIG. 8 after performing further CMOS processing steps including, for example, patterning the material stacks into patterned gate stacks 50, 52 respectively, wherein patterned gate stack 50 is located within the nFET device region 14 and the patterned gate stack 52 is present in the pFET device region 16. The patterned gate stack 50 includes a patterned first portion of the gate electrode layer 42', a patterned portion of plasma nitrided, nFET adjusted high k gate dielectric layer portion 38' and a patterned first portion of the optional interfacial layer 18', while patterned gate stack 52 includes a patterned second portion of the gate electrode layer 42", a patterned portion of plasma nitrided, pFET adjusted high k gate dielectric layer portion 40' and a patterned second portion of the optional interfacial layer 18". The patterning step includes the use of a conventional lithography (apply photoresist material, exposed resist material to a desired pattern of radiation and development using a resist developer) and etching (wet etching, dry etching or a combination thereof) process.

The further CMOS processing also may include forming source/drain extension regions (not shown) within the semiconductor substrate 12 at the footprint of each patterned gate stack. The source/drain extensions regions can be formed utilizing any known extension ion implantation process. After the extension ion implantation, an anneal can be used to activate the implanted extension ions. Next, optional sidewall spacer 54 can be formed utilizing any known process including deposition of a spacer material, followed by etching. Typical spacer materials include an oxide and/or a nitride. After formation of the spacer, source/drain regions 56 can be formed into semiconductor substrate 12 at the footprint of each patterned gate stack. The source/drain regions 56 can be formed utilizing a source/drain ion implantation process followed by annealing.

In some embodiments, metal semiconductor alloy contacts can now be formed utilizing any process that is capable of forming a metal semiconductor alloy atop a semiconductor material. In one embodiment, the metal semiconductor alloy contacts can be formed utilizing a silicide process. The silicide process can be self-aligned to the outer edge of the spacer. The silicide process includes forming a metal capable of forming a metal semiconductor alloy when reacted with a semiconductor material. The metal used in forming the metal semiconductor alloy contact can include, but is not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the patterned conductive material, when no optional patterned hard mask is present and the conductive material is composed of a Si-containing material.

Reference is now made to FIGS. 10-15 which are pictorial representations (through cross sectional views) illustrating the CMOS structure of the present disclosure during various stages of fabrication in accordance with another embodiment of the present application. This embodiment of the present disclosure begins by first providing the initial structure 10 shown in FIG. 1. As mentioned above, the initial structure 10 of FIG. 1 includes a semiconductor substrate 12 having an nFET device region 14 and a pFET device region 16, an optional interfacial layer 18 located on an upper surface of the semiconductor substrate in both device regions, and a high k gate dielectric layer 20 located on an upper surface of the optional interfacial layer 18.

Figure 10:
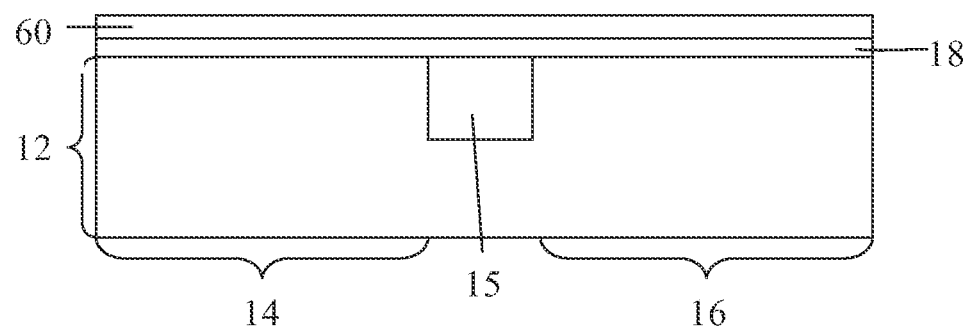
FIG. 10 is a pictorial representation (through a cross sectional view) depicting the initial structure of FIG. 1 after performing a plasma nitridation process, without any anneal, in accordance with another embodiment of the present application; the plasma nitridation process converts the high k gate dielectric layer of the initial structure into a plasma nitrided high k gate dielectric layer.

Referring now to FIG. 10, there is illustrated the initial structure of FIG. 1 after performing a plasma nitridation process, without any anneal. The plasma nitridation process performed at this stage converts the high k gate dielectric layer 20 of the initial structure into a plasma nitrided high k gate dielectric layer 60. The plasma nitridation process performed in this embodiment of the present disclosure includes the conditions mentioned above for plasma nitridation in the first embodiment of the present application. The plasma nitrided high k gate dielectric layer 60 that is formed has a concentration of nitrogen up to 15 atomic %. Typically, the plasma nitrided high k gate dielectric layer 60 that is formed has a concentration of nitrogen from 5 atomic % $N_2$ to 12 atomic % $N_2$.

Figure 11:
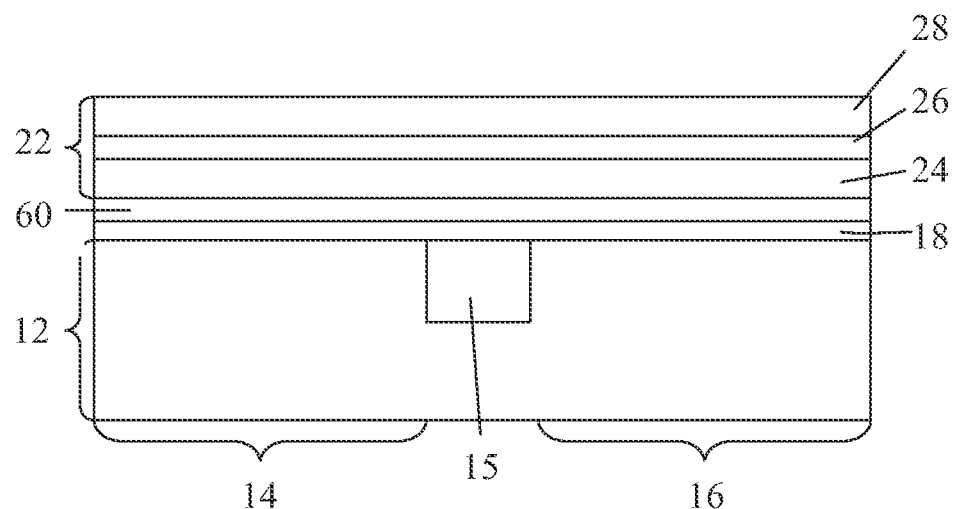
FIG. 11 is a pictorial representation (through a cross sectional view) depicting the structure of FIG. 10 after forming a trilayer metal stack on an upper surface of the plasma nitrided high k gate dielectric layer.

Referring now to FIG. 11, there is illustrated the structure of FIG. 10 after forming a trilayer metal stack 22 on an upper surface of the plasma nitrided high k gate dielectric layer 60. The trilayer metal stack 22 includes, from bottom to top, a first metal nitride layer 24, a metal layer 26 and a second metal nitride layer 28. The trilayer metal stack 22 including the first metal nitride layer 24, the metal layer 26 and the second metal nitride layer 28 is the same as that mentioned in the embodiment described in FIGS. 1-9 above. As such, the trilayer metal stack 22 includes materials and is formed using the techniques mentioned above in the embodiment described in FIGS. 1-9.

Figure 12:
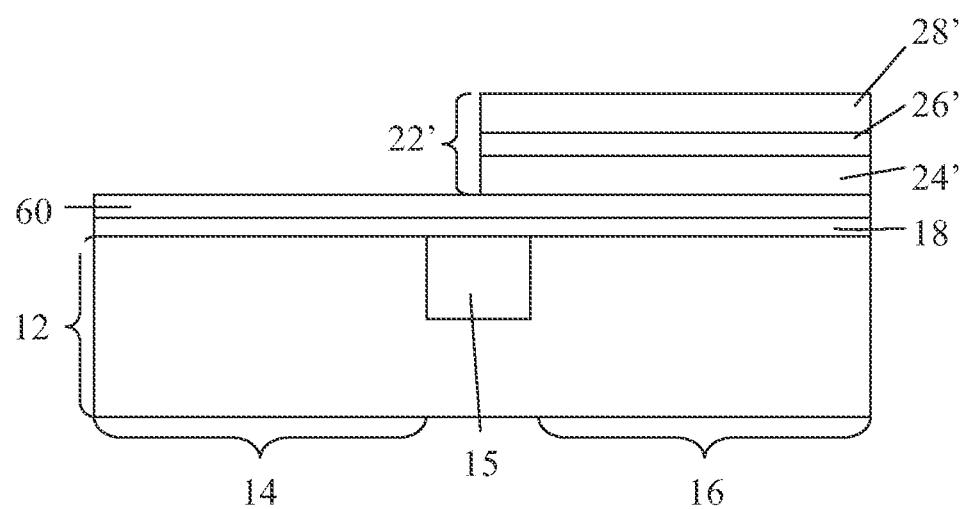
FIG. 12 is a pictorial representation (through a cross sectional view) of the structure of FIG. 11 after removing a first portion of the trilayer metal stack from atop the nFET device region, while leaving a second portion of the trilayer metal stack atop the pFET device region.

Referring to FIG. 12, there is illustrated the structure of FIG. 11 after removing a first portion of the trilayer metal stack 22 from atop the nFET device region 14, while leaving a second portion of the trilayer metal stack 22 atop the pFET device region 16. The remaining second portion of the trilayer stack, which is also referred herein as a patterned trilayer metal stack, is a labeled as 22' in the drawing. The structure shown in FIG. 12 is formed utilizing the same technique, i.e., lithography and etching, as mentioned above in forming the structure shown in FIG. 3.

Figure 13:
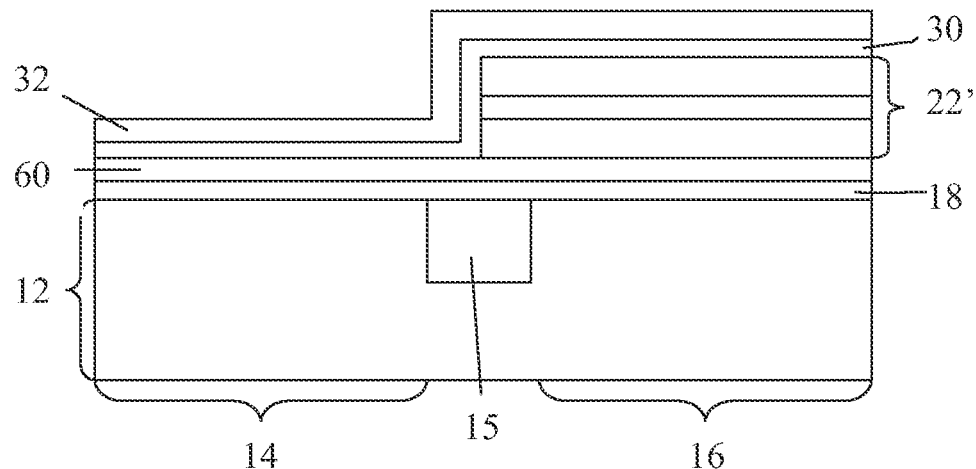
FIG. 13 is a pictorial representation (through a cross sectional view) illustrating the structure of FIG. 12 after forming an nFET threshold voltage adjusting material layer and an optional metallic material layer atop the exposed upper surfaces of the structure in both device regions.

Referring to FIG. 13, there is illustrated the structure of FIG. 12 after forming an nFET threshold voltage adjusting material layer 30 and an optional metallic material layer 32 atop the exposed upper surfaces of the structure in both device regions. The nFET threshold voltage adjusting material layer 30 and an optional metallic material layer 32 in this embodiment are composed of materials, and are formed by techniques as described above for the embodiment illustrated in FIGS. 1-9.

Figure 14:
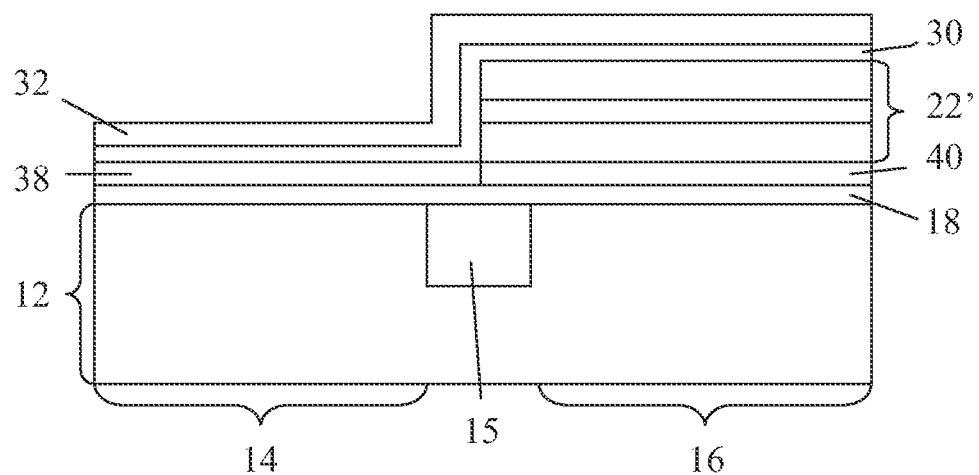
FIG. 14 is a pictorial representation (through a cross sectional view) illustrating the structure of FIG. 13 after performing an annealing that drives nFET threshold voltage adjusting species from the nFET threshold voltage adjusting material layer into the underlying plasma nitrided high k gate dielectric layer within the nFET device region and pFET threshold voltage adjusting species from a metal layer of the trilayer stack into the underlying plasma nitrided high k gate dielectric within the pFET device region.

Referring to FIG. 14, there is illustrated the structure of FIG. 13 after performing an annealing that drives nFET threshold voltage adjusting species from the nFET threshold voltage adjusting material layer 30 into the underlying plasma nitrided high k gate dielectric layer 60 within the nFET device 14 region and pFET threshold voltage adjusting species from metal layer 26 of the patterned trilayer stack 22' into the underlying plasma nitrided high k gate dielectric layer 60 within the pFET device region 16. In FIG. 14, reference numeral 38 denotes a plasma nitrided, nFET adjusted high k gate dielectric layer portion that includes nFET threshold voltage adjusting species, while reference numeral 40 denotes a plasma nitrided, pFET adjusted high k gate dielectric layer portion that includes pFET threshold voltage adjusting species. In some embodiments, the nFET and/or the pFET threshold voltage species may diffusion into portions of the underlying interfacial layer 18. The 'drive-in' anneal used in this embodiment of the present application includes the conditions mentioned above in regard to the drive-anneal used in forming the structure shown in FIG. 5.

Figure 15:
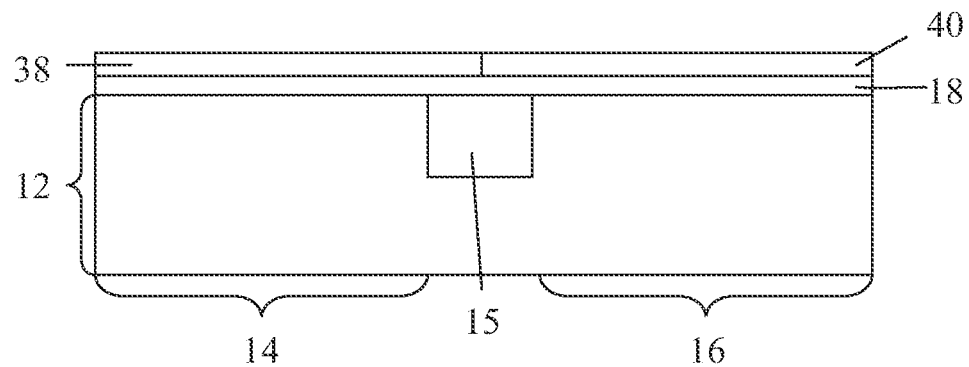
FIG. 15 is a pictorial representation (through a cross sectional view) depicting the structure of FIG. 14 after removing metal structures and the nFET threshold voltage adjusting material layer from both device regions.

Referring to FIG. 15, there is illustrated the structure of FIG. 14 after removing metal structures, e.g., the optional metallic material layer 32 and the patterned trilayer metal stack 22', and the nFET threshold voltage adjusting material layer 30 from both device regions. The removal of the metal structures is performed utilizing one or more etching steps including wet etching and/or dry etching. In one embodiment, one or more wet etching steps are employed in removing the metal structures from atop the plasma nitrided, nFET adjusted high k gate dielectric layer portion 38 and the plasma nitrided, pFET adjusted high k gate dielectric layer portion 40. The structure shown in FIG. 15 can processed as shown in FIGS. 8-9 above.

Reference is now made to FIGS. 16-19 which are pictorial representations (through cross sectional views) illustrating the CMOS structure of the present disclosure during various stages of fabrication in accordance with a further embodiment of the present application. The embodiment of the present disclosure begins by first providing the structure shown in FIG. 5.

Figure 16:
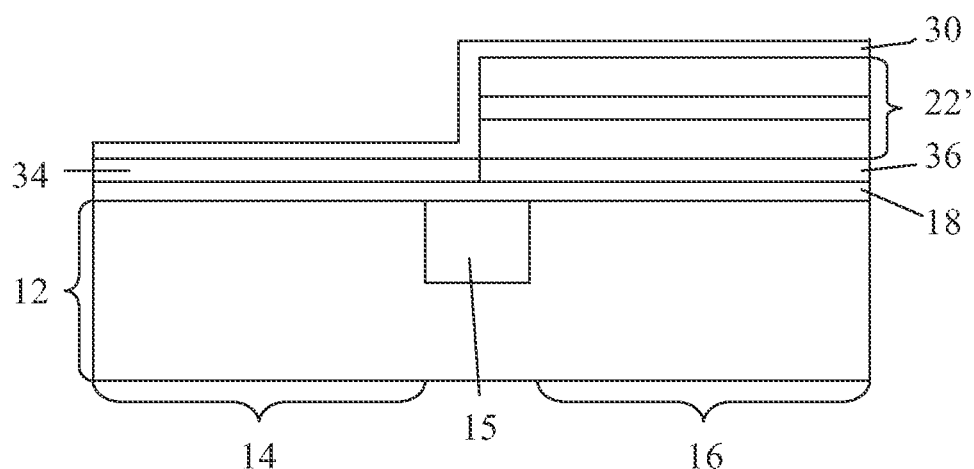
FIG. 16 is a pictorial representation (through a cross sectional view) depicting the structure of FIG. 5 after forming an nFET threshold voltage adjusting material layer atop the exposed upper surfaces of the structure in both device regions in accordance with a further embodiment of the present application.

Referring now to FIG. 16, there is illustrated the structure of FIG. 5 after forming an nFET threshold voltage adjusting material layer 30 atop the exposed upper surfaces of the structure in both device regions. As shown, the nFET threshold voltage adjusting material layer 30 is located directly on an upper surface of a portion of the high k gate dielectric layer 20 in the nFET device region 14, and directly on the upper surface of the patterned trilayer stack 22'. The nFET threshold voltage adjusting material layer 30 includes one of the materials mentioned above in the embodiment illustrated in FIGS. 1-9 and layer 30 can be formed as described above also.

Figure 17:
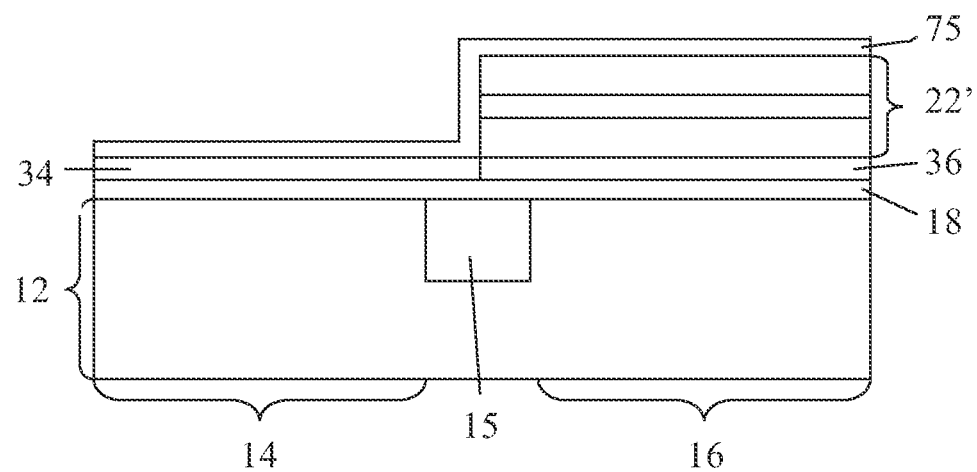
FIG. 17 is a pictorial representation (though a cross sectional view) depicting the structure of FIG. 16 after performing plasma nitridation and an oxygen-free anneal.

Referring to FIG. 17, there is shown the structure of FIG. 16 after performing plasma nitridation and oxygen-free annealing. The plasma nitridation process introduces nitrogen into the nFET threshold voltage adjusting material layer 30 in both device regions; some nitrogen may also be introduced into the portion of the high k gate dielectric layer 20 in the pFET region 16. The plasma nitridation is performed as described above in the embodiment illustrated in FIGS. 1-9. The oxygen-free annealing used in this embodiment includes the same conditions as mentioned above for the oxygen-free annealing in the embodiment illustrated in FIGS. 1-11. In FIG. 17, reference numeral 75 denotes the plasma nitrided nFET threshold voltage adjusting material layer that is formed in this step.

Figure 18:
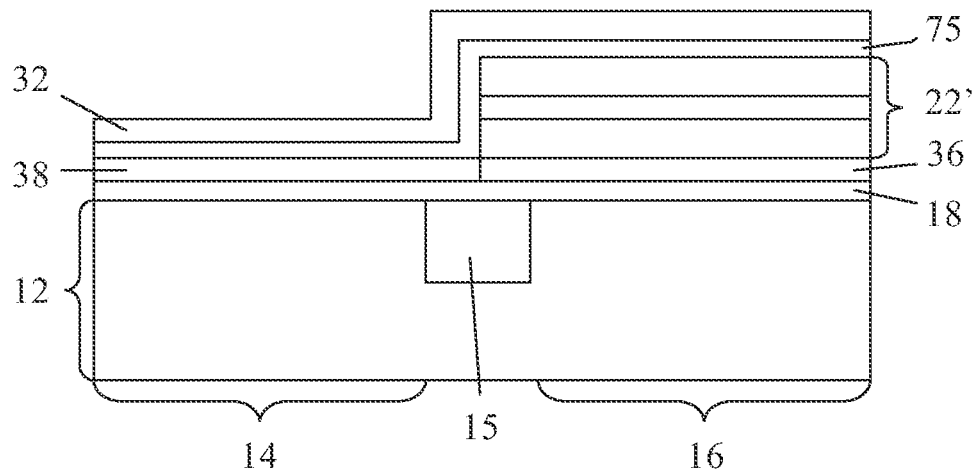
FIG. 18 is a pictorial representation (through a cross sectional view) depicting the structure of FIG. 17 after forming a metallic material layer atop the exposed upper surfaces of the structure in both device regions, and performing a drive in anneal.

Referring to FIG. 18, there is illustrated the structure of FIG. 17 after forming a metallic material layer 32 atop the exposed upper surfaces of the structure in both device regions, and performing a drive in anneal. The metallic material layer 32 formed in this embodiment includes one of the materials, and is formed using one of the techniques, mentioned above for the optional metallic material layer 32 used in the embodiment illustrated in FIGS. 1-9. The drive in anneal includes conditions mentioned above for the embodiment illustrated in FIGS. 1-9. In FIG. 18, reference numeral 38 denotes a plasma nitrided, nFET threshold voltage adjusted high k gate dielectric layer portion of the structure, while reference numeral 36 denotes the pFET threshold voltage adjusting high k gate dielectric layer portion of the structure. In this embodiment, the plasma nitrided, nFET threshold voltage adjusted high k gate dielectric layer portion 36 has a nitrogen concentration up to 15 atomic % $N_2$; the pFET threshold voltage adjusting high k gate dielectric layer portion does not typically include nitrogen since none of the layers within the pFET device region 16 were subjected to plasma nitridation.

Figure 19:
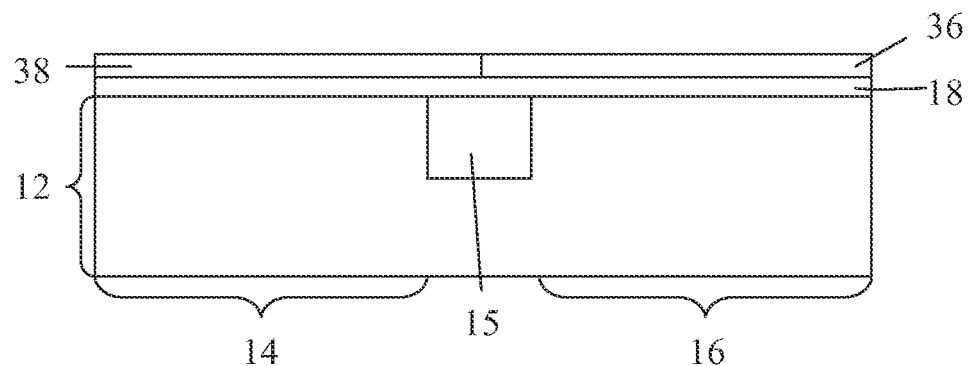
FIG. 19 is a pictorial representation (through a cross sectional view) depicting the structure of FIG. 18 after removing metal structures and the nFET threshold voltage adjusting material layer from both device regions.

Referring to FIG. 19, there is illustrated the structure of FIG. 18 after removing metal structures, e.g., the metallic material layer 32 and the patterned trilayer metallic stack 22', and the nFET threshold voltage adjusting material layer from both device regions. The removal of the metal structures and the nFET threshold voltage adjusting material layer 30 from both device regions is the same as described above for removing those layers in the embodiment described in FIGS. 1-9.

Figure 20:
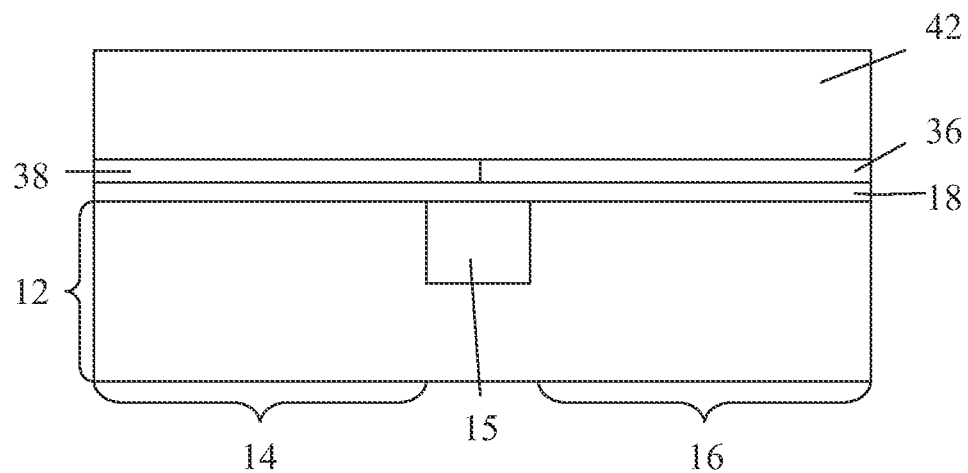
FIG. 20 is a pictorial representation (through a cross sectional view) depicting the structure of FIG. 19 after forming a gate electrode layer within both device regions.

Referring to FIG. 20, there is illustrated the structure of FIG. 19 after forming a gate electrode layer 42 within both device regions. The gate electrode layer 42 used in this embodiment can include one of the conductive materials and can be formed using one of the techniques mentioned above in forming the gate electrode layer 42 in the embodiment illustrated in FIGS. 1-9.

Figure 21:
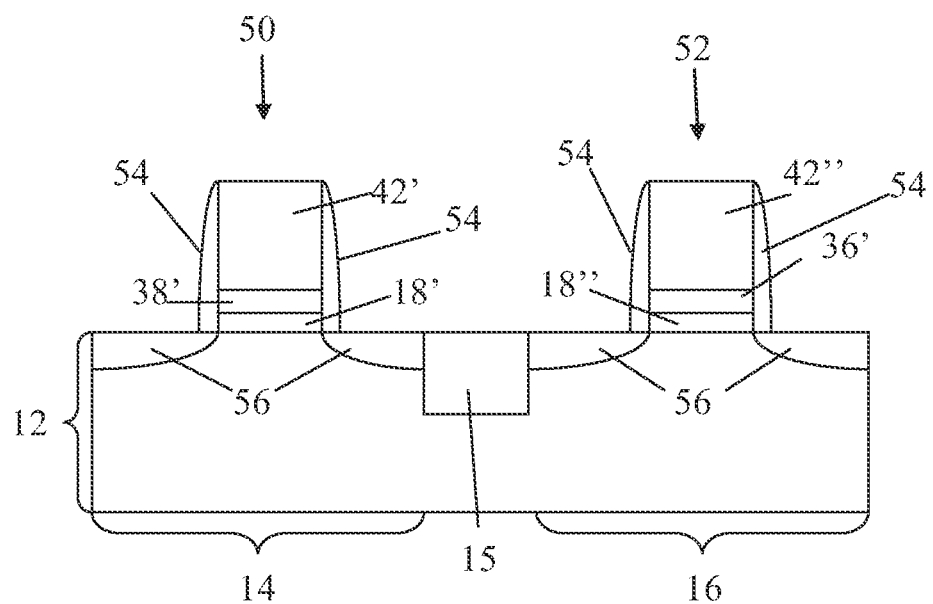
FIG. 21 is a pictorial representation (through a cross sectional view) depicting the structure of FIG. 20 after performing further CMOS processing steps.

Referring to FIG. 21, there is illustrated the structure of FIG. 20 after performing further CMOS processing steps including, for example, patterning the materials stacks into patterned gate stacks 90, 92 respectively, wherein patterned gate stack 90 is located within the nFET device region 14 and the patterned gate stack 92 is present in the pFET device region 16. The patterned gate stack 90 includes a patterned first portion of the gate electrode layer 42', a patterned portion of plasma nitrided, nFET adjusted high k gate dielectric layer portion 38' and a patterned first portion of the optional interfacial layer 18', while patterned gate stack 92 includes a patterned second portion of the gate electrode layer 42", a patterned portion of pFET adjusted high k gate dielectric layer portion 40' and a patterned second portion of the optional interfacial layer 18". The patterning step includes the use of a conventional lithography (applying a photoresist material, exposed resist material to a desired pattern of radiation and development using a resist developer) and etching (wet etching, dry etching or a combination thereof) process. The structure shown in FIG. 21 also includes optional sidewall spacers 54 and source/drain regions 56 which include materials and are formed as described above in the embodiment illustrated in FIGS. 1-9.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present disclosure not be limited to the exact forms and details described and illustrated, but fall within the scope of the appended claims.

What is claimed is:

1. A method of forming a complementary metal oxide semiconductor comprising:
providing a plasma nitrided, nFET threshold voltage adjusted high k gate dielectric layer portion within an nFET device region of a semiconductor structure and a plasma nitrided, pFET threshold voltage adjusted high k gate dielectric layer portion within a pFET device region of the semiconductor substrate, wherein said providing comprises:
forming a high k gate dielectric layer within the nFET device region of the semiconductor substrate and the pFET device region of the semiconductor substrate;
forming a patterned trilayer metal stack including at least a pFET threshold voltage adjusting material layer on a portion of the high k gate dielectric within the pFET device region, while leaving another portion of the high k gate dielectric within the nFET device region exposed;
forming an nFET threshold voltage adjusting material layer in both device regions;
performing an anneal, wherein said anneal diffuses nFET threshold voltage adjusting species from the nFET threshold voltage adjusting material layer into the underlying portion of the high k gate dielectric layer in the nFET device region forming an nFET threshold voltage adjusted high k gate dielectric layer portion, while diffusing pFET threshold voltage species from the pFET threshold voltage adjusting material layer into the underlying portion of the high k gate dielectric in the pFET device region forming a pFET threshold voltage adjusted high k gate dielectric layer portion;
removing the nFET threshold voltage adjusting material layer and the patterned trilayer metal stack exposing both the nFET threshold voltage adjusted high k gate dielectric layer portion and the pFET threshold voltage adjusted high k gate dielectric layer portion; and
subjecting the exposed nFET threshold voltage adjusted high k gate dielectric portion and the pFET threshold voltage adjusted high k gate dielectric layer portion to plasma nitridation forming the plasma nitrided, nFET threshold voltage adjusted high k gate dielectric layer portion and the plasma nitrided, pFET threshold voltage adjusted high k gate dielectric layer portion;
forming a gate electrode layer atop both the plasma nitrided, nFET threshold voltage adjusted high k gate dielectric layer portion and the plasma nitrided, pFET threshold voltage adjusted high k gate dielectric layer portion; and
forming an nFET gate stack in the nFET device region and a pFET gate stack in the pFET device region, wherein the nFET gate stack includes, from bottom to top, the plasma nitrided, nFET threshold voltage adjusted high k gate dielectric layer portion and a first patterned portion of the gate electrode layer and the pFET gate stack includes, from bottom to top, the plasma nitrided, pFET threshold voltage adjusted high k gate dielectric layer portion and a second patterned portion of the gate electrode layer.

2. The method of claim 1 wherein the forming of the patterned trilayer metal stack includes depositing on said high k gate dielectric a first metal nitride layer, said pFET threshold voltage adjusting material layer, and a second metal nitride layer, and patterning said first metal nitride layer, said pFET threshold voltage adjusting material layer, and second metal nitride layer.

3. The method of claim 1 wherein the nFET threshold voltage adjusting material layer includes a rare earth metal-containing material and an alkaline earth metal-containing material, and said pFET threshold voltage adjusting layer material is selected from Ta, Ti, Al and Ge.

4. The method of claim 1 further comprising forming a metallic layer atop the nFET threshold voltage adjusting material layer prior to performing said anneal.

5. The method of claim 1 wherein said anneal is performed at a temperature from 400° C. to 1100° C.

6. The method of claim 1 wherein said plasma nitridation is performed at a temperature from 0° C. to 500° C.

7. The method of claim 1 further comprising performing an oxygen-free anneal in an ambient substantially absent of oxygen after said plasma nitridation, wherein said oxygen-free anneal is performed in an inert ambient and at a temperature from 400° C. to 800° C.

8. A method of forming a complementary metal oxide semiconductor comprising:
providing a plasma nitrided, nFET threshold voltage adjusted high k gate dielectric layer portion within an nFET device region of a semiconductor structure and a plasma nitrided, pFET threshold voltage adjusted high k gate dielectric layer portion within a pFET device region of the semiconductor substrate:
forming a high k gate dielectric layer within the nFET device region of the semiconductor substrate and the pFET device region of the semiconductor substrate;

subjecting the high k gate dielectric layer to plasma nitridation to form a plasma nitrided high k gate dielectric layer;

forming a patterned trilayer metal stack including at least a pFET threshold voltage adjusting material layer on a portion of the plasma nitrided high k gate dielectric within the pFET device region, while leaving another portion of the plasma nitrided high k gate dielectric within the nFET device region exposed;

forming an nFET threshold voltage adjusting material layer in both device regions;

performing an anneal, wherein said anneal diffuses nFET threshold voltage adjusting species from the nFET threshold voltage adjusting material layer into the underlying portion of the plasma nitrided high k gate dielectric layer in the nFET device region to form the plasma nitrided, nFET threshold voltage adjusted high k gate dielectric layer portion, while diffusing pFET threshold voltage species from the pFET threshold voltage adjusting material layer into the underlying portion of the plasma nitrided high k gate dielectric in the pFET device region to form the plasma nitrided, pFET threshold voltage adjusted high k gate dielectric layer portion; and removing the nFET threshold voltage adjusting material layer and the patterned trilayer metal stack exposing both the plasma nitrided, nFET threshold voltage adjusted high k gate dielectric layer portion and the plasma nitrided, pFET threshold voltage adjusted high k gate dielectric layer portion;

forming a gate electrode layer atop both the plasma nitrided, nFET threshold voltage adjusted high k gate dielectric layer portion and the plasma nitrided, pFET threshold voltage adjusted high k gate dielectric layer portion; and forming an nFET gate stack in the nFET device region and a pFET gate stack in the pFET device region, wherein the nFET gate stack includes, from bottom to top, the plasma nitrided, nFET threshold voltage adjusted high k gate dielectric layer portion and a first patterned portion of the gate electrode layer and the pFET gate stack includes, from bottom to top, the plasma nitrided, pFET threshold voltage adjusted high k gate dielectric layer portion and a second patterned portion of the gate electrode layer.

9. The method of claim 8 wherein the forming of the patterned trilayer metal stack includes depositing on said high k gate dielectric a first metal nitride layer, said pFET threshold voltage adjusting material layer, and a second metal nitride layer, and patterning said first metal nitride layer, said pFET threshold voltage adjusting material layer, and second metal nitride layer.

10. The method of claim 8 wherein the nFET threshold voltage adjusting material layer includes a rare earth metal-containing material and an alkaline earth metal-containing material, and said pFET threshold voltage adjusting layer material is selected from Ta, Ti, Al and Ge.

11. The method of claim 8 further comprising forming a metallic layer atop the nFET threshold voltage adjusting material layer prior to performing said anneal.

12. The method of claim 8 wherein said anneal is performed at a temperature from 400° C. to 1100° C.

13. The method of claim 1 wherein said plasma nitridation is performed at a temperature from 0° C. to 500° C. and no oxygen-free anneal step follows said plasma nitridation.

14. A method of forming a complementary metal oxide semiconductor comprising:

providing a plasma nitrided, nFET threshold voltage adjusted high k gate dielectric layer portion within an nFET device region of a semiconductor structure and a plasma nitrided, pFET threshold voltage adjusted high k gate dielectric layer portion within a pFET device region of the semiconductor substrate, wherein the plasma nitrided, nFET threshold voltage adjusted high k gate dielectric layer portion comprises a high gate dielectric material containing up to 15 atomic % nitrogen and an nFET threshold voltage adjusting species therein, and the plasma nitrided, pFET threshold voltage adjusted high k gate dielectric layer portion comprises a high gate dielectric material containing up to 15 atomic % nitrogen and a pFET threshold voltage adjusting species therein;

forming a gate electrode layer atop both the plasma nitrided, nFET threshold voltage adjusted high k gate dielectric layer portion and the plasma nitrided, pFET threshold voltage adjusted high k gate dielectric layer portion; and forming an nFET gate stack in the nFET device region and a pFET gate stack in the pFET device region, wherein the nFET gate stack includes, from bottom to top, the plasma nitrided, nFET threshold voltage adjusted high k gate dielectric layer portion and a first patterned portion of the gate electrode layer and the pFET gate stack includes, from bottom to top, the plasma nitrided, pFET threshold voltage adjusted high k gate dielectric layer portion and a second patterned portion of the gate electrode layer.

15. The method of claim 14 wherein the providing the plasma nitrided, nFET threshold voltage adjusted high k gate dielectric layer portion within the nFET device region of the semiconductor structure and the plasma nitrided, pFET threshold voltage adjusted high k gate dielectric layer portion within the pFET device region of the semiconductor substrate includes:

forming a high k gate dielectric layer within the nFET device region of the semiconductor substrate and the pFET device region of the semiconductor substrate;

subjecting the high k gate dielectric layer to plasma nitridation to form a plasma nitrided high k gate dielectric layer;

forming a patterned trilayer metal stack including at least a pFET threshold voltage adjusting material layer on a portion of the plasma nitrided high k gate dielectric within the pFET device region, while leaving another portion of the plasma nitrided high k gate dielectric within the nFET device region exposed;

forming an nFET threshold voltage adjusting material layer in both device regions;

performing an anneal, wherein said anneal diffuses nFET threshold voltage adjusting species from the nFET threshold voltage adjusting material layer into the underlying portion of the plasma nitrided high k gate dielectric layer in the nFET device region to form the plasma nitrided, nFET threshold voltage adjusted high k gate dielectric layer portion, while diffusing pFET threshold voltage species from the pFET threshold voltage adjusting material layer into the underlying portion of the plasma nitrided high k gate dielectric in the pFET device region to form the plasma nitrided, pFET threshold voltage adjusted high k gate dielectric layer portion; and removing the nFET threshold voltage adjusting material layer and the patterned trilayer metal stack exposing both the plasma nitrided, nFET threshold voltage adjusted high k gate dielectric layer portion and the plasma nitrided, pFET threshold voltage adjusted high k gate dielectric layer portion.

16. The method of claim 14 wherein the providing the plasma nitrided, nFET threshold voltage adjusted high k gate dielectric layer portion within the nFET device region of the semiconductor structure and the plasma nitrided, pFET threshold voltage adjusted high k gate dielectric layer portion within the pFET device region of the semiconductor substrate includes:
- forming a high k gate dielectric layer within the nFET device region of the semiconductor substrate and the pFET device region of the semiconductor substrate;
- forming a patterned trilayer metal stack including at least a pFET threshold voltage adjusting material layer on a portion of the high k gate dielectric within the pFET device region, while leaving another portion of the high k gate dielectric within the nFET device region exposed;
- forming an nFET threshold voltage adjusting material layer in both device regions;
- performing an anneal, wherein said anneal diffuses nFET threshold voltage adjusting species from the nFET threshold voltage adjusting material layer into the underlying portion of the high k gate dielectric layer in the nFET device region forming an nFET threshold voltage adjusted high k gate dielectric layer portion, while diffusing pFET threshold voltage species from the pFET threshold voltage adjusting material layer into the underlying portion of the high k gate dielectric in the pFET device region forming a pFET threshold voltage adjusted high k gate dielectric layer portion;
- removing the nFET threshold voltage adjusting material layer and the patterned trilayer metal stack exposing both the nFET threshold voltage adjusted high k gate dielectric layer portion and the pFET threshold voltage adjusted high k gate dielectric layer portion; and
- subjecting the exposed nFET threshold voltage adjusted high k gate dielectric portion and the pFET threshold voltage adjusted high k gate dielectric layer portion to plasma nitridation forming the plasma nitrided, nFET threshold voltage adjusted high k gate dielectric layer portion and the plasma nitrided, pFET threshold voltage adjusted high k gate dielectric layer portion.

* * * * *